United States Patent

Takashi et al.

[11] Patent Number: 5,805,024
[45] Date of Patent: Sep. 8, 1998

[54] PHASE LOCK LOOP SYSTEM INCLUDING A PRIMARY PHASE LOCK LOOP APPARATUS AND A HIGH ORDER PHASE LOCK LOOP APPARATUS

[75] Inventors: Terumi Takashi, Chigasaki; Naoki Satoh; Akihiko Hirano, both of Odawara; Eisaku Saiki, Yokohama; Masakazu Hosino, Gunma-ken; Ryushi Shimokawa, Takasaki, all of Japan

[73] Assignees: Hitachi, Ltd.; Hitachi Microcomputer System Ltd., both of Tokyo, Japan

[21] Appl. No.: 536,264

[22] Filed: Sep. 29, 1995

[30] Foreign Application Priority Data

Oct. 4, 1994 [JP] Japan .................................. 6-239853

[51] Int. Cl.⁶ .............................. G11B 5/00; G11B 27/10; H03L 7/087; H03L 7/10
[52] U.S. Cl. .............................. 331/17; 331/1 A; 331/11; 375/376; 360/51; 327/159
[58] Field of Search .................................. 360/51; 331/11, 331/14, 17, 10, 1 A; 375/376; 327/156, 159

[56] References Cited

U.S. PATENT DOCUMENTS 4,855,689  8/1989  Kinkel .......................................... 331/17
5,157,354  10/1992  Saiki et al. .............................. 331/1 A

FOREIGN PATENT DOCUMENTS 5-143909  6/1993  Japan .
6-84289   3/1994  Japan .
7-21702   1/1995  Japan .

OTHER PUBLICATIONS

Nobuo Ogawa, "New PLL Techniques", published by Ohm Co., Ltd., 1986, pp. 16–30.

Primary Examiner—Arnold Kinkead
Attorney, Agent, or Firm—Fay, Sharpe, Beall, Fagan, Minnich & McKee

[57] ABSTRACT

A phase lock loop system includes: a phase detecting circuit which operates on the basis of a signal waveform; a current output circuit for generating a current value from a phase difference detected by the phase detecting circuit; a filter which is constructed by only a resistor in a phase locked state by a synchronizing signal and by a capacitor and the resistor upon phase following state; and a voltage controlled oscillator for controlling an oscillation frequency by a voltage output of the filter. The phase lock loop system operates as a primary phase lock loop circuit in the phase locked state by the synchronizing signal and operates as a secondary phase lock loop circuit upon phase following state.

16 Claims, 9 Drawing Sheets

PHASE LOCK LOOP SYSTEM INCLUDING A PRIMARY PHASE LOCK LOOP APPARATUS AND A HIGH ORDER PHASE LOCK LOOP APPARATUS

BACKGROUND OF THE INVENTION

The invention relates to a phase lock loop system and, more particularly, to a phase lock loop circuit for forming a reproduction clock synchronized with a read signal in a signal reproducing circuit of a magnetic or optical recording reproducing device, an LSI to realize such a circuit, and further an information recording reproducing device in which such a circuit is installed.

Generally, an information recording reproducing device has a phase lock loop system in order to, for example, generate a sampling clock synchronized with a signal that is read out from a disk.

A conventional phase lock loop system has, for example, secondary phase lock loop circuits of two stages in order to reduce a time for a phase lock. First, the first secondary phase lock loop circuit having a higher loop gain is made operative and a phase lock is performed. Subsequently, the second secondary phase lock loop circuit having a low loop gain is made operative in a data reproducing operation. The reason why the circuit having the high loop gain is first made operative is because since a frequency of a synchronizing signal is not constant due to a rotational fluctuation of the magnetic disk or the like, it is necessary to cope with such a frequency change and to execute the phase lock at a high speed.

As literatures showing the conventional techniques, there are provided JP-A-6-84289, JP-A-5-143909, and JP-A-7-21702 are proposed here.

In the field of a communication in which the frequency of the synchronizing signal is stable or the like, it is known that the primary phase lock loop circuit is used to execute the phase lock. For example, please refer to "New PLL Techniques" published by Ohm Co., Ltd., pages 16–30.

SUMMARY OF THE INVENTION

It is an object of the invention to provide a phase lock loop system for a data reproducing apparatus with a novel construction.

According to the system of the invention, in order to reduce a time that is required for a phase lock, namely, in order to execute the phase lock at a high speed, a primary phase lock loop circuit is first made operative to thereby execute a phase locking operation and, in a data reproduction, a high order, in the embodiment, a secondary phase lock loop circuit is made operative.

According to a phase lock loop circuit for executing a phase locking operation of an embodiment of the invention, a phase detection is performed by a signal waveform and a selecting circuit to select either one of a filter having one or more poles and a filter having no pole as a filter that is connected to a digital-analog converter which is driven by a phase detecting circuit is provided. Thus, a primary phase lock loop circuit constructed by the phase detecting circuit, D/A converter, filter circuit having no pole, and clock generating circuit can be realized.

The phase lock loop circuit of the invention operates as a primary phase lock loop circuit in a phase locking operation and operates as a high order phase lock loop circuit in a data reproducing operation. The primary phase lock loop circuit is constructed by a phase detecting circuit, a digital-analog converter, a filter having no pole, and a clock generating circuit and frequency characteristics of a whole closed loop have one pole. The high order phase lock loop circuit is constructed by a phase detecting circuit, a digital-analog converter, a filter having one or more poles, and a clock generating circuit and frequency characteristics of a whole closed loop have two or more poles. On construction, as for a filter having one or more poles, a part or all of the filter having no pole can be also commonly constructed. Even if the primary phase lock loop circuit has the same phase lock characteristics as those of the high order phase lock loop circuit, namely, has the same loop gain, a phase margin can be made larger than that of the high order phase lock loop circuit by about 20° or more. Therefore, a loop gain can be set to be higher by the primary phase lock loop circuit rather than the high order phase lock loop circuit.

According to the invention, in addition to the above phase lock loop circuit, a phase comparator for comparing phases of a reference clock of a writing system and a sampling clock and a converting circuit for connecting the phase comparator and the filter having one or more poles are provided and a frequency synchronization with the reference clock of the writing system is performed. The phase comparator compares the phases of the reference clock of the writing system and the sampling clock. The converting circuit outputs a phase comparison result to the filter. Thus, an oscillation frequency of a clock generating circuit before the primary phase lock loop circuit operates coincides with a frequency of the reference clock, namely, with a frequency of a read signal. Thus, the phase lock loop circuit of the invention can suppress the time of phase locking for a frequency difference between a signal frequency after switching to the data reproducing operation and a clock frequency.

BRIEF DESCRIPTION OF THE DRAWINGS

These and other object and technical advantages of the present invention will be readily apparent from the following description of the preferred exemplary embodiments of the invention in conjunction with the accompanying drawings, in which.

DETAILED DESCRIPTION OF THE PREFERRED EMBODIMENTS

Embodiments of the invention will now be described.

Figure 1:
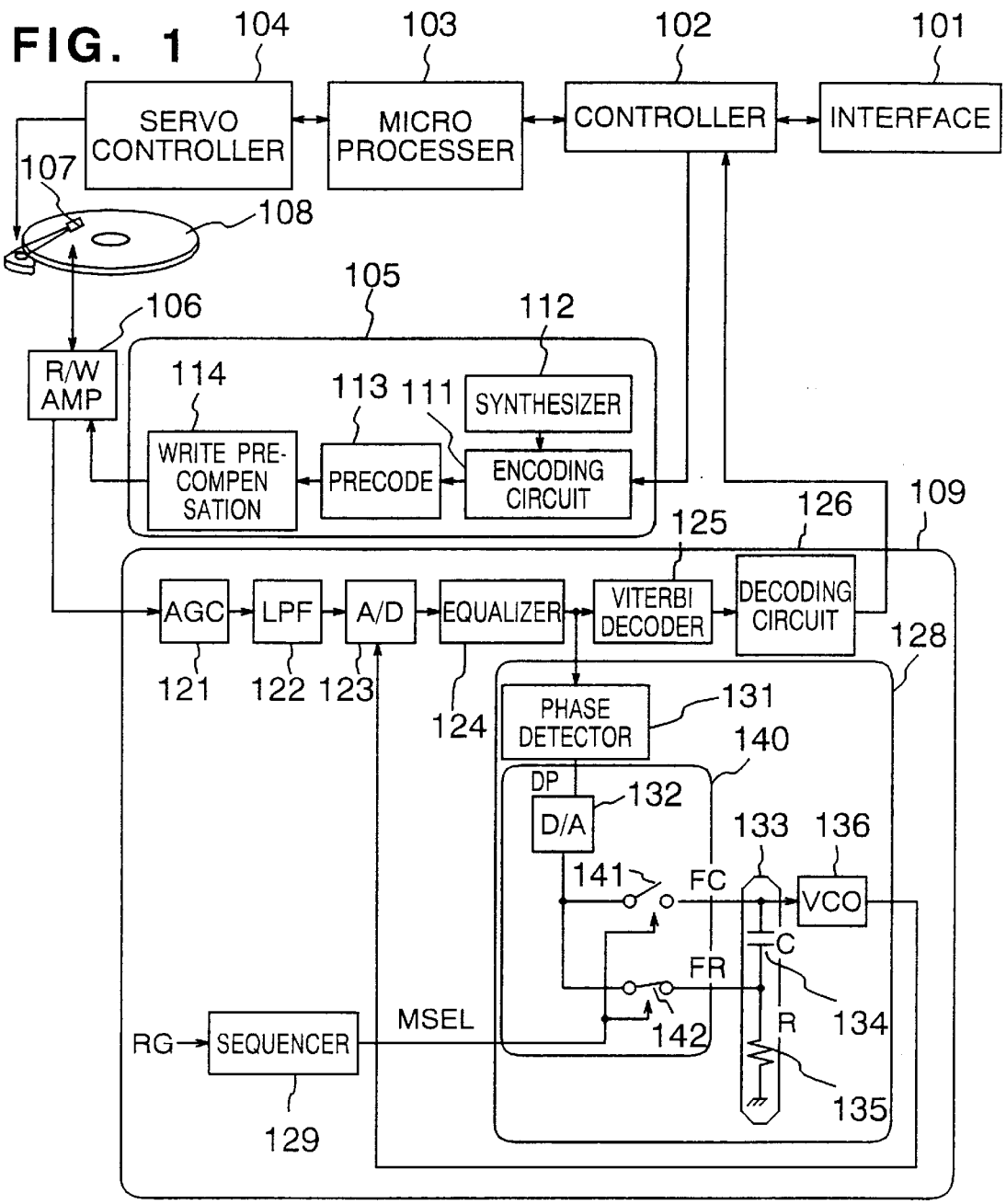
FIG. 1 is a block diagram of a magnetic disk apparatus according to an embodiment of the invention.

FIG. 1 is a block diagram showing mainly a reproducing signal processing circuit in a magnetic disk apparatus. In the diagram, the magnetic disk apparatus is constructed by: an interface circuit 101; a controller 102; a microprocessor 103; a servo controller 104; a recording signal processing circuit 105; a recording reproducing amplifier (R/W amplifier) 106; a recording reproducing head (R/W head) 107; a recording medium 108; and a reproducing signal processing circuit 109. The recording signal processing circuit 105 is constructed by: an encoding circuit 111; a synthesizer 112; a precoder 113; and a write pre-compensation circuit 114. The reproducting signal processing circuit 109 using a Viterbi decoding system is constructed by: an automatic gain controller (AGC circuit) 121; a low pass filter (LPF) circuit 122; an analog-digital converter (A/D converter) 123; an equalizer 124; a Viterbi decoder 125; a decoding circuit 126; a phase lock loop circuit 128; and a sequencer 129. First, general recording and reproducing operations of data in a magnetic disk will now be described.

The recording of the data is executed as follows. Data to be recorded is outputted from a host computer (not shown) as packet data to which address information is added. The data is supplied to the controller 102 through the interface circuit 101. The controller 102 discriminates the address information and sends an instruction to the microprocessor 103 so as to move the R/W head 107 to a predetermined position corresponding to the address. The microprocessor 103 moves the R/W head 107 to the designated position through the servo controller 104. After completion of the movement of the R/W head 107, the controller 102 adds a synchronizing signal and a check code to the recording data and transmits the resultant data to the recording signal processing circuit 105. The encoding circuit 111 of the recording signal processing circuit 105 encodes the recording data of one byte and converts it to serial bit data and outputs the bit data in response to a reference clock that is generated from the synthesizer 112. The precoder 113 executes a process of $1/(1-D^2)$, where $D^2$ means 2 time of previous bit, and corrects non-linear characteristics upon magnetic recording by the write precompensation circuit 114 and, after that, outputs as a write signal. The write signal is supplied to the R/W head 107 through the R/W amplifier 106 and is recorded at an objective position on the recording medium 108.

The reproduction of the data is started by instructing a read address through the interface circuit 101. The controller 102 discriminates the address and instructs the microprocessor 103 so as to move the R/W head 107 in a manner similar to the writing operation. After the R/W head 107 was moved, the signal recorded to the recording medium 108 is inputted as a read signal to the reproducing signal processing circuit 109 through the R/W head 107 and R/W amplifier 106. In the reproducing signal processing circuit 109, the AGC circuit 121 sets the read signal to a predetermined signal amplitude and, further, the LPF 122 eliminates noises out of a signal band. The A/D converter 123 samples a read waveform in response to a sampling clock that is generated from the phase lock loop circuit 128. The equalizer 124 executes a waveform shaping process. The viterbi decoder 125 executes a bit discrimination of a high precision using the correlation of the signals. The decoding circuit 126 decodes the bit data and transmits as byte data to the controller 102. The interface circuit 101 transfers the byte data to a host computer (not shown), thereby finishing a series of data reading operation.

A construction and the operation of the phase lock loop circuit 128 in such a magnetic disk apparatus will now be described in detail. The phase lock loop circuit 128 for generating the sampling clock is constructed by: a primary phase lock loop circuit whose frequency characteristics have one pole; and a secondary phase lock loop circuit having two poles. First, the phase lock (phase locking operation) of the sampling clock was performed by the synchronizing signal added at of the writing operation by the primary phase lock loop. Subsequently the phase lock loop circuit 128 executes the phase following operation by the secondary phase lock loop.

The phase lock loop circuit 128 is one component element of the reproducing signal processing circuit 109 and generates the sampling clock of the A/D converter 123. The phase lock loop circuit 128 is constructed by: a phase detecting circuit 131; a digital-analog (D/A) converter 132; current switches 141 and 142; a filter circuit 133 comprising a capacitor 134 and a resistor 135; and a voltage controlled oscillator (VCO circuit) 136. The phase lock loop circuit 128 executes a phase locking operation by an MSEL control signal that is generated from the sequencer 129. In the primary phase lock loop circuit of the embodiment, the current switch 141 is opened and the current switch 142 is short-circuited. The primary phase lock loop circuit is thus constructed by: the phase detecting circuit 131, D/A converter 132, resistor 135, and VCO circuit 136. In the secondary phase lock loop circuit, the current switch 142 is opened and the current switch 141 is short-circuited. The secondary phase lock loop circuit is thus constructed by the phase detecting circuit 131, D/A converter 132, resistor 135, capacitor 134, and VCO circuit 136.

In the embodiment, the resistor 135 constructing the filter is commonly used in the primary phase lock loop circuit and the secondary phase lock loop circuit.

Figure 2:
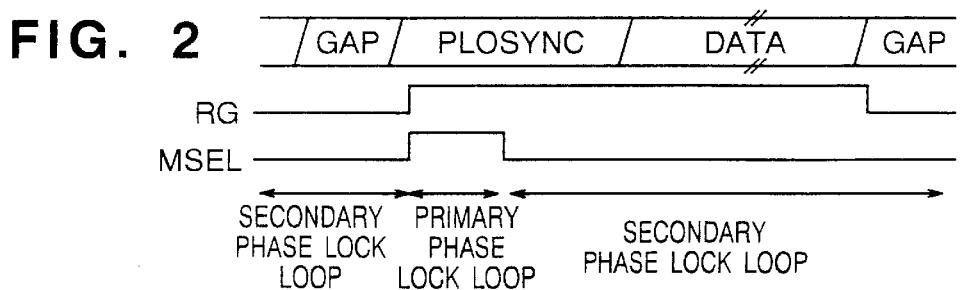
FIG. 2 is a control sequence of a phase lock loop circuit shown in FIG. 1.

Prior to explaining the operation of the phase lock loop circuit 128, a phase locking step in a magnetic recording reproducing device will now be described with reference to FIG. 2. A signal RG is a signal to instruct the reproducing operation and is generated from the controller 102. The signal RG is made active (="1") in an area to write the synchronizing signal (PLOSYNC) before data reproduction. The sequencer 129 detects a leading edge of the signal RG and makes a signal MSEL active (="1") for a predetermined period of time and makes it inactive (="0") before entering a data area. In the conventional phase lock loop circuit, when the signal MSEL="1", the phase locking operation has been executed by the secondary phase lock loop circuit with higher loop gain. According to the phase lock loop circuit of the invention, however, when the signal MSEL="1", the phase locking operation by the primary phase lock loop circuit is executed and, when MSEL="0", the data reproducing operation by the secondary phase lock loop circuit is executed.

The operation of the phase lock loop circuit 128 of the invention will now be described in detail. The phase detector 131 detects a phase error from a read waveform which is inputted through the AGC circuit 121, LPF 122, A/D converter 123, and equalizer 124 and from which a waveform distortion was eliminated. The phase detector 131 outputs the phase error to a current converting circuit 140. The current converting circuit 140 transmits a current value corresponding to the phase error that is outputted from the D/A converter 132 to terminals FC and FR in correspondence to the current switches 141 and 142 which are controlled by the state of the signal MSEL, respectively. The filter circuit 133 becomes a filter circuit having frequency characteristics, which will be explained hereinafter, through the terminals FC and FR and controls the oscillation frequency of the VCO circuit 136. The VCO circuit 136 generates the sampling clock of the A/D converter 123. By repetitively executing the above processes, the sampling phase of the read waveform is adjusted and the phase locking operation is completed.

The operation of the phase lock loop circuit will now be described in accordance with the operating mode.

(1) Phase locking operation (signal MSEL="1")

In this operating mode, the current switch 141 is opened, the current switch 142 is short-circuited, and the terminal FC is set into an open state. In such a state, the current flowing from the D/A converter 132 flows only in the resistor 135 because an impedance of an input of the VCO circuit 136 is high. Since the capacitor 134 continuously keeps an initial voltage, an input voltage (Vvco) of the VCO circuit 136 is expressed as shown by the following equation (1).

$$Vvco = i \cdot R + Vc \tag{1}$$

where, i: current value flowing from the D/A converter 132

R: resistance value of the resistor 135

Vc: initial voltage of the capacitor 134 and determines a center frequency of the VCO circuit 136

Frequency characteristics when they are seen from the terminal FR show filter characteristics having no pole.

Thus, open loop characteristics H1(s) of the phase lock loop circuit are shown by the following equation (2).

$$H1(s) = Kp \cdot Kd \cdot R \cdot Kv/s \tag{2}$$

where, Kp: gain [1/rad] of the phase detecting circuit 131

Kd: output current value [A] for a unit phase error flowing from the D/A converter 132

R: resistance value [Ω] of the resistor 135

Kv: gain [rad/s/V] of the VCO circuit 136 s: Laplace operator and shows a phase integration element of the VCO circuit 136

From the equation (2), it will be understood that the denominator of H1(s) corresponds to the primary phase lock loop circuit having one pole since the term of (s) of the VCO circuit 136 exists.

(2) Phase following operation (signal MSEL="0")

In this operating mode, the current switch 141 is short-circuited, the current switch 142 is opened, and the terminal FR is set into an open state. In such a state, the current flowing from the D/A converter 132 flows to the capacitor 134 and resistor 135 because an impedance of the input of the VCO circuit 136 is high. The input voltage (Vvco) of the VCO circuit 136 is expressed by the following equation (3).

$$Vvco(s) = i \cdot (R + 1/(s \cdot C)) \tag{3}$$

where, i: current value flowing from the D/A converter 132

R: resistance value of the resistor 135

C: capacitance of the capacitor 134 s: Laplace operator

The frequency characteristics when they are seen from the terminal FC show filter characteristics having one pole.

From the above construction, open loop characteristics H2(s) of the phase lock loop circuit are shown by the following equation (4)

$$H2(s) = Kp \cdot Kd \cdot (R + 1/(s \cdot C)) \cdot Kv/s \tag{4}$$

where, Kp: gain [l/rad] of the phase detecting circuit 131

Kd: output current value [A] for the unit phase error flowing from the D/A converter 132

R: resistance value [109 ] of the resistor 135

C: capacitance [F] of the capacitor 134

Kv: gain [rad/s/V] of the VCO circuit 136 s: Laplace operator and indicates the phase integration element of the VCO circuit 136

From the equation (4), it will be understood that the denominator of H2(s) corresponds to the secondary phase lock loop circuit since there are two poles of the pole of the filter circuit 133 and the pole of the VCO circuit 136.

As shown in the above open loop characteristics, according to the phase lock loop circuit of the embodiment, the connection of the D/A converter 132 and the filter circuit 133 is changed by the current switches 141 and 142 and it will be understood that the phase locking operation has the primary characteristics and that the phase following operation has the secondary characteristics.

Particularly, in the embodiment, the resistor 135 constructing the filter is commonly used in the primary and secondary phase lock loop circuits and, even in the primary phase locking operation, the center frequency of the VCO circuit 136 is given based on a voltage of the capacitor 134. Therefore, even when the primary and secondary phase locking operations are switched, the sampling clock frequency in this instance doesn't suddenly change and it doesn't become a factor of extension of the phase locking time.

Figure 3:
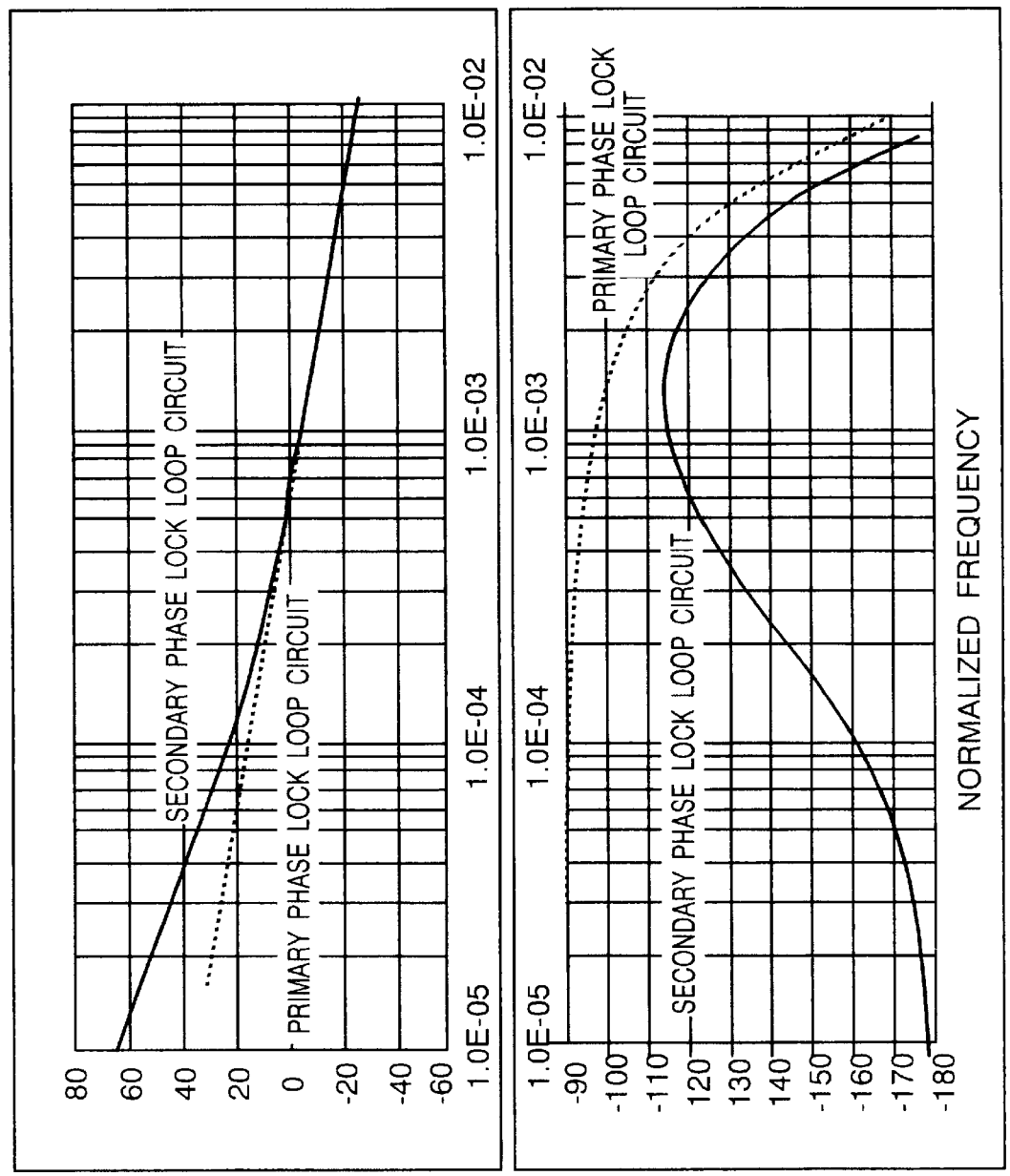
FIG. 3 shows open loop frequency characteristics of primary and secondary phase lock loop circuits.

FIG. 3 shows open loop frequency characteristics of the primary and secondary phase lock loop circuits in the same circuit constants (Kp, Kd, Kv). From FIG. 3, a phase margin indicative of the stability of a feedback circuit in case of the primary type is larger than that of the secondary type by 25°. Therefore, assuming that the phase margins of both of the primary and secondary types are equal, it will be understood that a loop gain of the primary phase lock loop circuit can be raised higher than that of the secondary phase lock loop circuit. In case of the embodiment, a zero-crossing frequency can be set to be higher by about 1.4 times. Therefore, in case of the primary phase lock loop circuit, the phase locking time can be reduced and a high speed phase lock loop can be realized. In the embodiment, although the phase detecting circuit 131 has detected the phase error by using the output signal of the equalizer 124, the phase error can be also detected from the output of the A/D converter 123.

Figure 4:
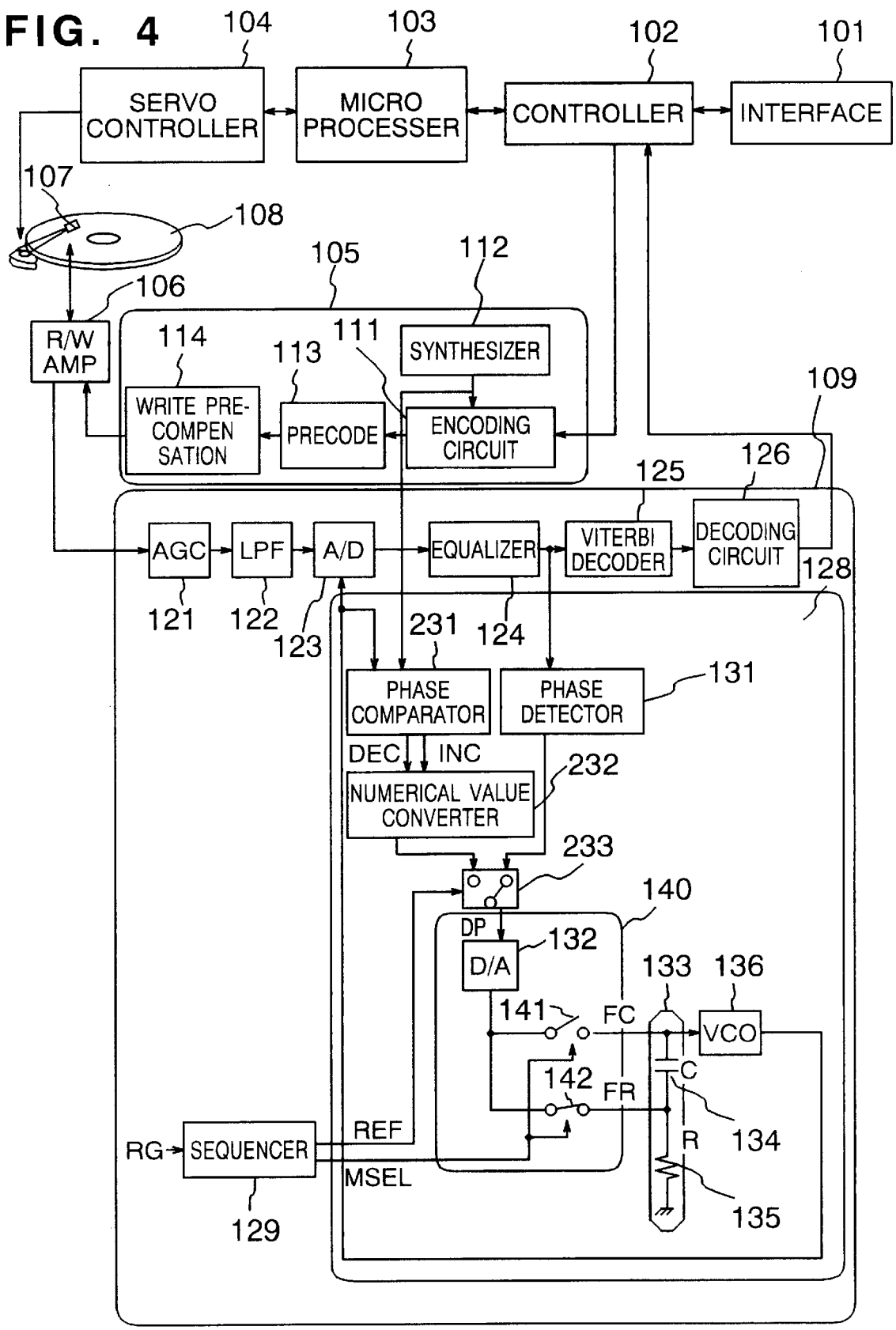
FIG. 4 is a block diagram of a magnetic disk apparatus according to another embodiment of the invention.

FIG. 4 shows another embodiment of the invention. In the diagram, reference numeral 231 denotes a phase comparator; 232 a numerical value converter; and 233 a selector. In FIG. 4, the same component elements as those shown in FIG. 1 are designated by the same reference numerals. The phase lock loop circuit shown in FIG. 4 is provided with a frequency lock loop circuit of a write reference clock and a sampling clock. The phase comparator 231 compares phases of the write reference clock that is generated from the synthesizer 112 and the sampling clock that is generated from the VCO circuit 136. When the phase of the write reference clock is advanced, a signal INC is outputted. When it is delayed, on the contrary, a signal DEC is outputted. As such a circuit, it is possible to use the same circuit as the phase comparator used conventionally in the reproducing signal processing circuit of the magnetic recording reproducing device. The numerical value converter 232 connects one signal INC and one signal DEC as an output of the phase comparator 231 to a plurality of bit inputs of the D/A converter 132. For example, in case of the D/A converter of five bits corresponding to a complementary expression of 2, the numerical value converter 232 outputs "01010" from the most significant bit when the signal INC is active. When the signal DEC is active, the converter 232 outputs "10110". When both of the signals INC and DEC are inactive, the converter 232 outputs "00000". The selector 233 selects a numerical value DP that is outputted to the D/A converter 132 by a signal REF which is outputted from the sequencer 129. When the signal REF="1", the selector 233 selects output of the numerical value converter 232. When REF="0", the selector 233 selects the output of the phase detector 131. Therefore, when the signal REF="1", a phase comparison result of the phase comparator 231 is supplied from the D/A converter 132 to the filter circuit 133 through the numerical value converter 232. In this instance, the current switch 141 is short-circuited, the current switch 142 is opened, and the phase lock loop circuit constructs the secondary type. The phase and frequency of the sampling clock are then the same as those of the write reference clock and the synchronization is completed. On the other hand, when the signal REF="0", in a manner similar to FIG. 1, the primary and secondary phase lock loop circuits are sequentially switched and the phase locking operation and the phase following operation are executed.

Figure 5:
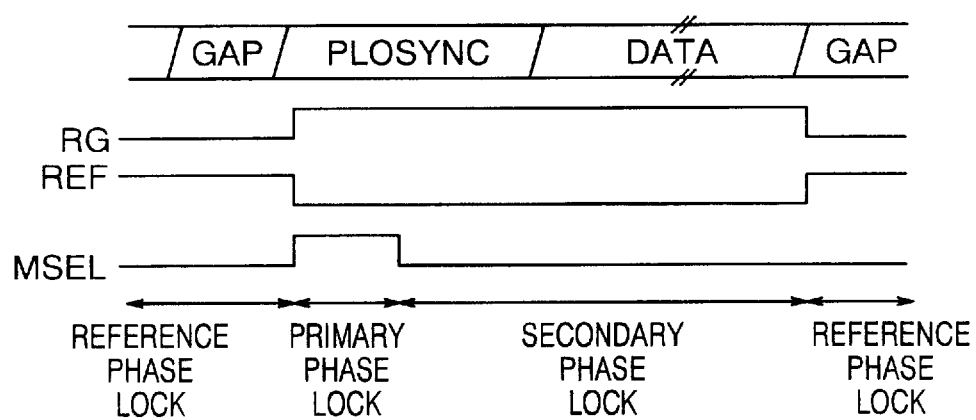
FIG. 5 is a control sequence of a phase lock loop circuit shown in FIG. 4.

A control sequence of the phase lock loop circuit of the magnetic recording reproducing device using the phase comparator 231 and phase detector 131 is determined by the signals REF and MSEL as shown in FIG. 5. The signal REF is the inverted signal of the signal RG. The signal MSEL is the signal which is made active for a predetermined period of time after the signal RG was made active in a manner similar to FIG. 2. By using such a sequence, the phase and frequency locking operations with the write reference clock have been completed before the primary phase lock loop circuit operates. The problem as a drawback of the primary phase lock loop circuit such that a phase error occurs in the case where the read signal frequency and the oscillation frequency of the VCO circuit are different doesn't occur as well.

Figure 6:
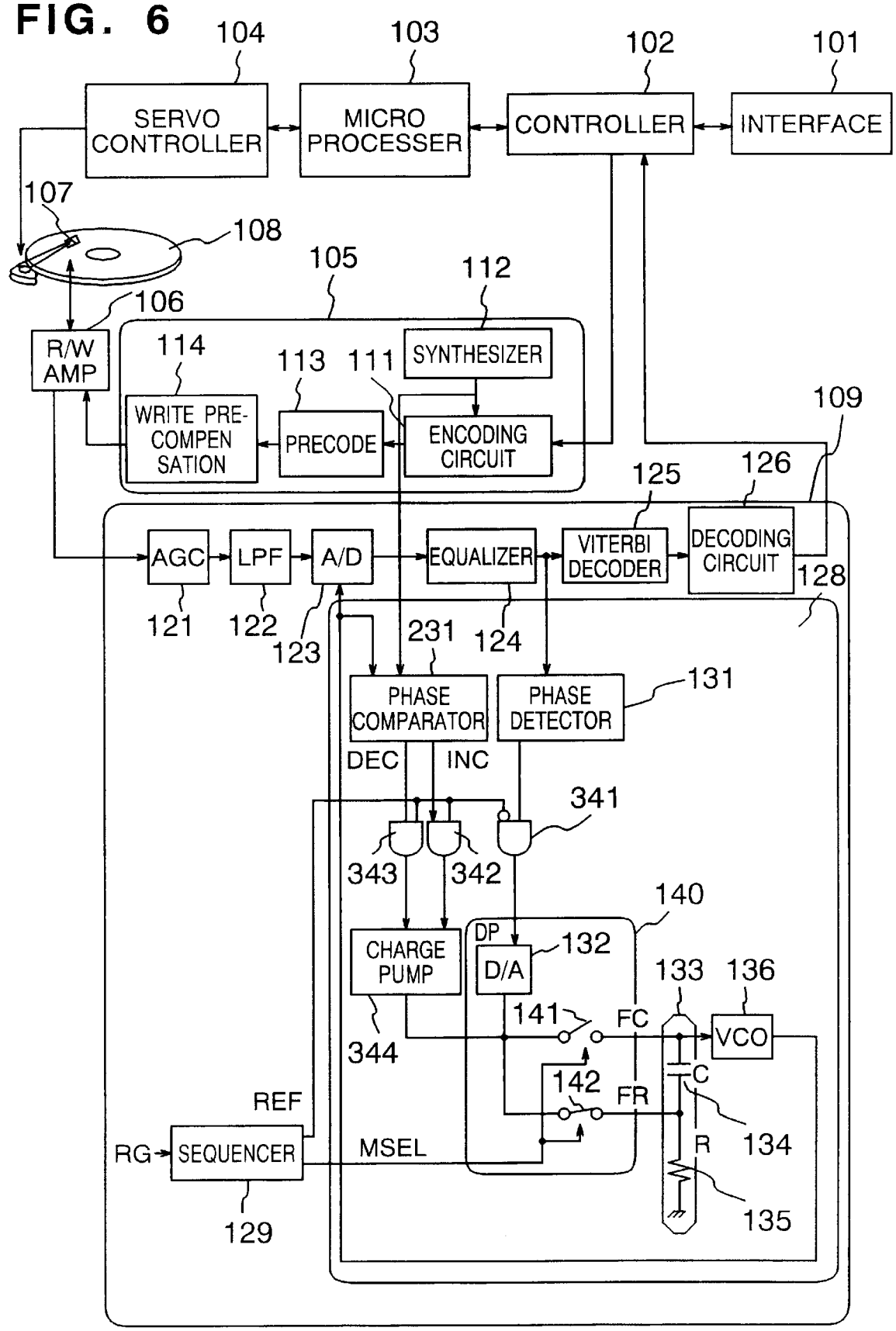
FIG. 6 is a diagram of an embodiment of another phase lock loop circuit shown in the magnetic disk apparatus of FIG. 4.

FIG. 6 shows another embodiment of the phase lock loop circuit in FIG. 4. In the embodiment, in place of the above numerical value converter 232, AND circuits 342 and 343 and a charge pump circuit 344 are provided. Only when the signal REF="1", the AND circuits 342 and 343 transmits the output of the phase comparator 231 to the charge pump circuit 344, thereby supplying a current to the capacitor 134 and resistor 135 of the filter circuit 133. Even with such a circuit construction, a phase lock loop circuit with the write reference clock can be realized. Particularly, according to the embodiment, since an amount of current to be supplied to the filter circuit 133 can be independently set irrespective of a current output range of the D/A converter 132, generality of the phase lock loop circuit with the write reference clock is improved.

Figure 7:
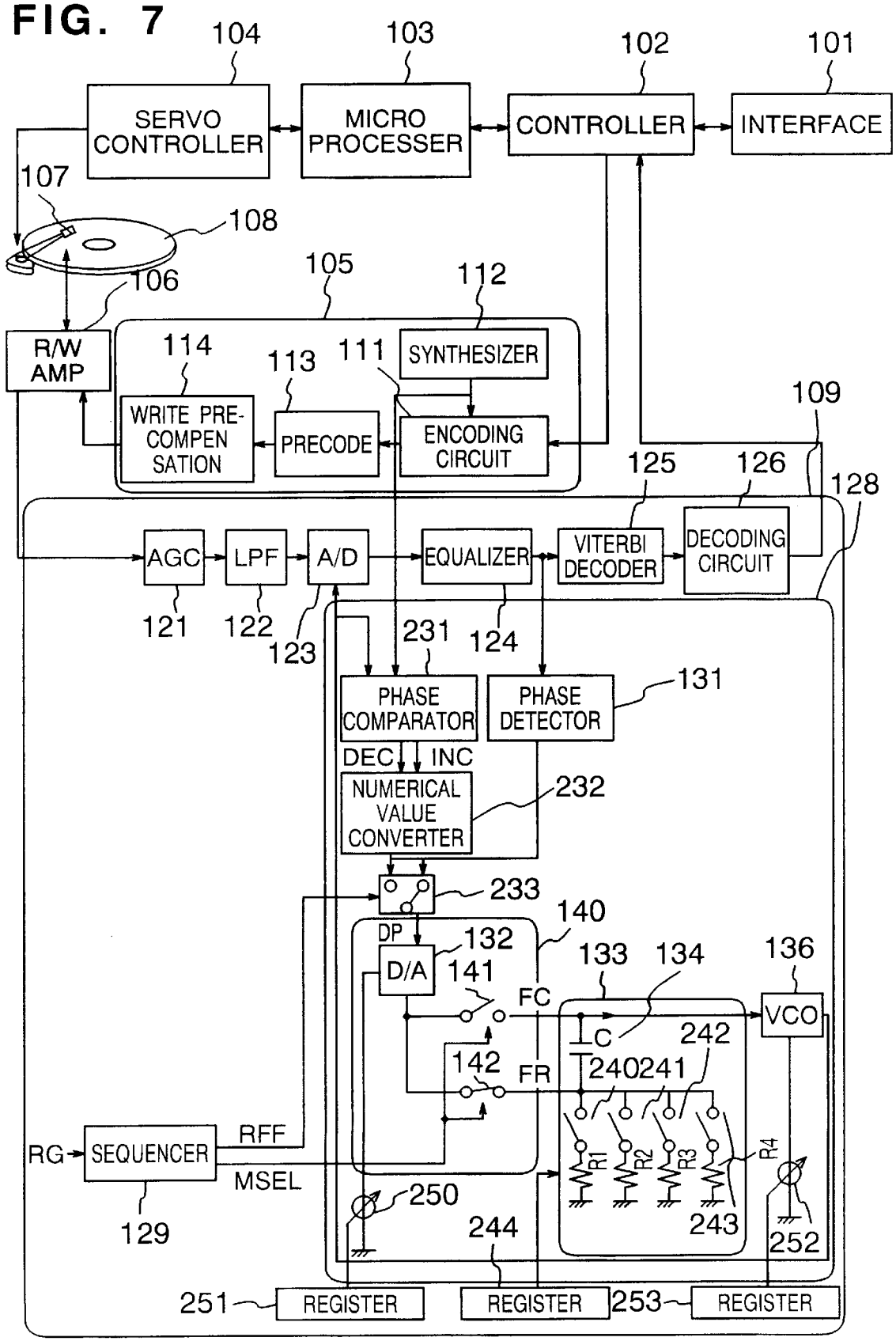
FIG. 7 is a block diagram of a magnetic disk apparatus according to another embodiment of the invention.

FIG. 7 shows an embodiment of the magnetic recording reproducing device which executes a constant density recording. A phase lock loop circuit which is applied to the constant density recording has: a cut-off frequency varying circuit for varying the frequency characteristics of the filter circuit 133 corresponding to the recording position of the magnetic recording medium; a gain varying circuit for varying a loop gain; and an oscillation frequency (center frequency) varying circuit for varying a transfer speed. In the diagram, the cut-off frequency varying circuit is constructed by a plurality of resistors (R1, R2, R3, R4), selecting circuits 240, 241, 242, and 243, and a register 244. The gain varying circuit is constructed by a reference current source 250 and a register 251. Further, the oscillation frequency varying circuit is constructed by a reference current source 252 and a register 253. In the embodiment, explanation will now be made with respect to the case where the magnetic recording medium is divided into the four radial direction. Generally, a data transfer frequency is low in the inner rim side track and is, contrarily, high in the outer rim side track. In correspondence to it, it is necessary to set the phase lock loop circuit as follows.

It is necessary to set the current of the D/A converter 132 to a small value in the inner rim side track and to a large value in the outer rim side track. The reference current source 250 gives the corresponding current value by the register 251. A cut-off frequency of the filter circuit 133 is determined by the capacitor 134 and resistance values R1, R2, R3, and R4. The corresponding resistor is selected by each of the selecting circuits 240, 241, 242, and 243 and register 244. For example, assuming that the resistor R1 is a resistor corresponding to the inner rim side track, the selecting circuit 240 is short-circuited and the other selecting circuits 241, 242, and 243 are opened and connected to the capacitor 134. The oscillation frequency of the VCO circuit 136 is set to a low value in the inner rim side track and to a high value in the outer rim side track, so that the reference current source 252 gives the corresponding current value by the register 253. Such D/A converter 132, filter circuit 133, and VCO circuit 136 execute operations similar to those mentioned above by the current switches 141 and 142 together with the phase locking operation by the primary phase lock loop circuit of the invention and the phase following operation by the secondary phase lock loop circuit. Therefore, the invention can be also directly applied to a phase lock loop circuit in the constant density recording. Another embodiment of the construction of the current converting circuit 140 will now be shown and described.

Figure 8:
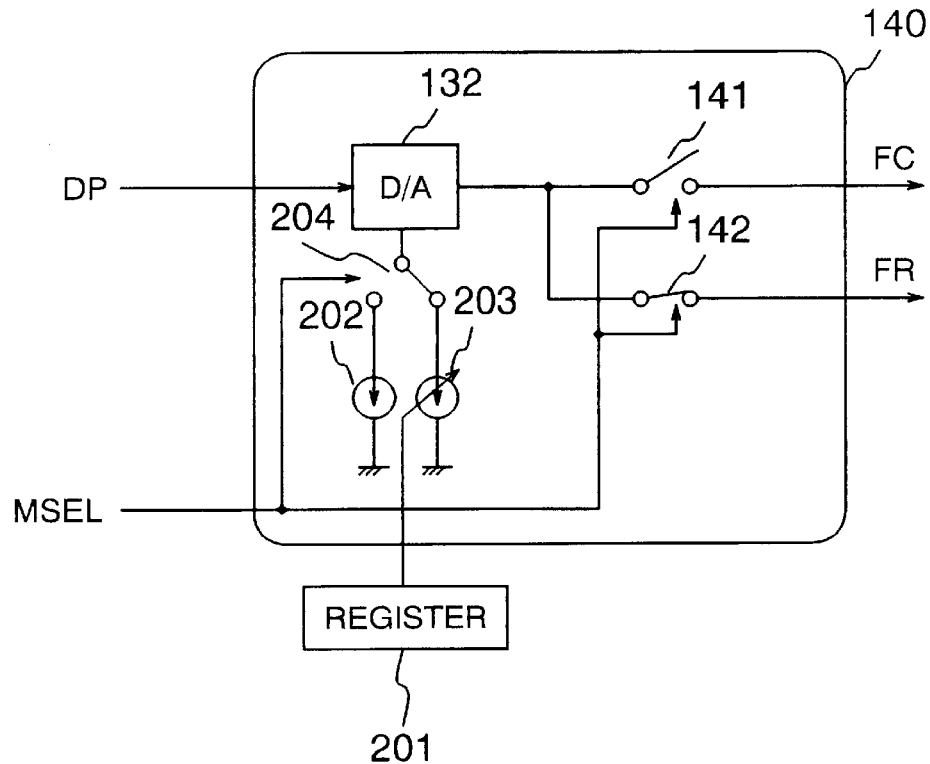
FIG. 8 shows another embodiment of a digital-analog converter.

FIG. 8 shows an example of a construction of the current converting circuit in which the loop gain of the primary phase lock loop circuit can be set from the outside. In the diagram, reference numeral 201 denotes a register; 202 a fixed current source; 203 a variable current source; and 204 a current selecting circuit. In FIG. 8, the same component elements as those shown in FIG. 1 are designated by the same reference numerals. The D/A converter 132 uses a current value of the fixed current source 202 or variable current source 203 as a reference and outputs a current to the terminals FC and FR through the current switches 141 and 142. The current selecting circuit 204 selects the variable current source 203 when the signal MSEL="1" and selects the fixed current source 202 when MSEL="0". Therefore, the fixed current source 202 corresponds to a reference current at the time of the secondary phase locking operation and the variable current source 203 corresponds to a reference current at the time of the primary phase locking operation. The reference current of the D/A converter 132 in the primary phase lock loop circuit can be set from the outside by the register 201. For example, the register 201 is set by the microprocessor 103 or the like and the current of the D/A converter 132 at the time of the operation of the primary phase lock loop circuit can be varied. The current converting circuit 140 of the above construction is effective when forming an LSI of the signal processing circuit including the phase lock loop circuit of the invention. Since the user of the LSI can arbitrarily set a phase locking time, generality of the LSI can be raised.

Figure 9:
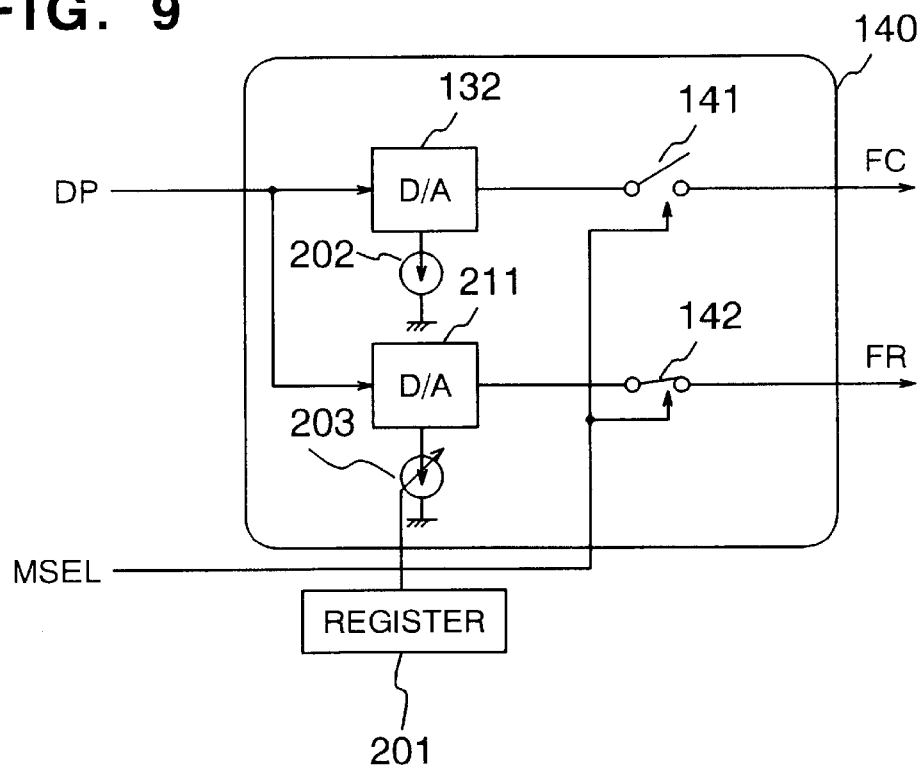
FIG. 9 shows another embodiment of the digital-analog converter.

Similarly, FIG. 9 shows another example of the construction of the current converting circuit 140 in which the loop gain of the primary phase lock loop circuit can be set from the outside. In the diagram, reference numeral 211 denotes a D/A converter and component elements similar to those in FIG. 8 are designated by the same reference numerals. The embodiment has an example of the construction such that two D/A converters are provided and a transient phase fluctuation of the sampling clock when the phase locking operation and the phase following operation are switched is suppressed. The D/A converter 132 is used in the secondary phase lock loop circuit and an output current thereof is determined by the fixed current source 202. On the other hand, the D/A converter 211 is used in the primary phase lock loop circuit and the variable current source 203 which can be set by the set value of the register 201 is connected to the D/A converter 211 and can be set from the outside by the microprocessor 103 or the like. The currents generated from the D/A converters 132 and 211 are transmitted to the terminal FR in case of the primary phase lock loop operation and to the terminal FC in case of the secondary phase lock loop operation by the current switches 141 and 142. With such a construction, although a circuit scale of the D/A converter increases, since the switching of the reference current source as in the construction of FIG. 8 is not performed, a current fluctuation in the D/A converter is not outputted to the filter circuit. Therefore, a phase fluctuation upon switching of the phase locking operation can be suppressed.

Figure 10:
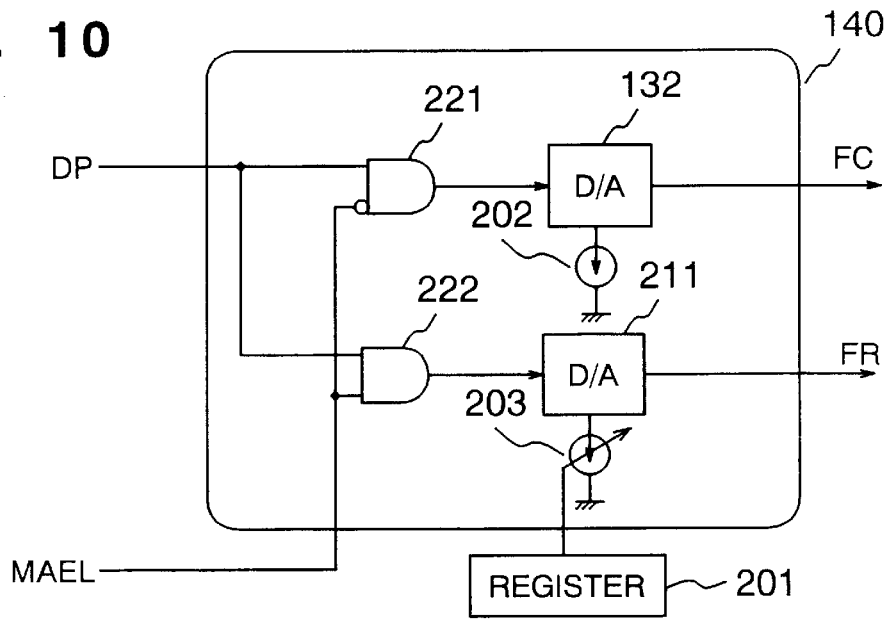
FIG. 10 shows another embodiment of the digital-analog converter.

Similarly, FIG. 10 shows another example of the construction of the current converting circuit 140 in which the loop gain of the primary phase lock loop circuit can be set from the outside. In the diagram, reference numerals 221 and 222 denote AND circuits and the same component elements as those in FIG. 8 are designated by the same reference numerals. In the embodiment, influences by the ON resistances of the current switches 141 and 142 mentioned above are reduced. The D/A converter 132 receives the phase error through the AND circuit 221 and outputs the current to the terminal FC by using the fixed current source 202 as a reference. The D/A converter 211 receives the phase error through the AND circuit 222 and outputs the current to the terminal FR by using the variable current source 203 which can be set by the set value of the register 201 as a reference. When the signal MSEL which is outputted from the sequencer 129 is equal to "1", namely, at the time of the primary phase locking operation, an output of the AND circuit 221 is set to "0" irrespective of a phase error signal DP. Therefore, as for the output of the D/A converter 132, neither sink nor source of the current, the terminal FC is set to the same state as the open state. On the other hand, the AND circuit 222 transmits the phase error signal DP to the D/A converter 211 and the current corresponding to the phase error flows to the terminal FR. Therefore, even when the current switches 141 and 142 don't exist, the construction of the primary phase lock loop circuit can be similarly realized. On the contrary, when the signal MSEL="0", the D/A converter 132 operates and the output of the D/A converter 211 is set to "0", so that the construction of the secondary phase lock loop circuit can be realized.

Figure 11:
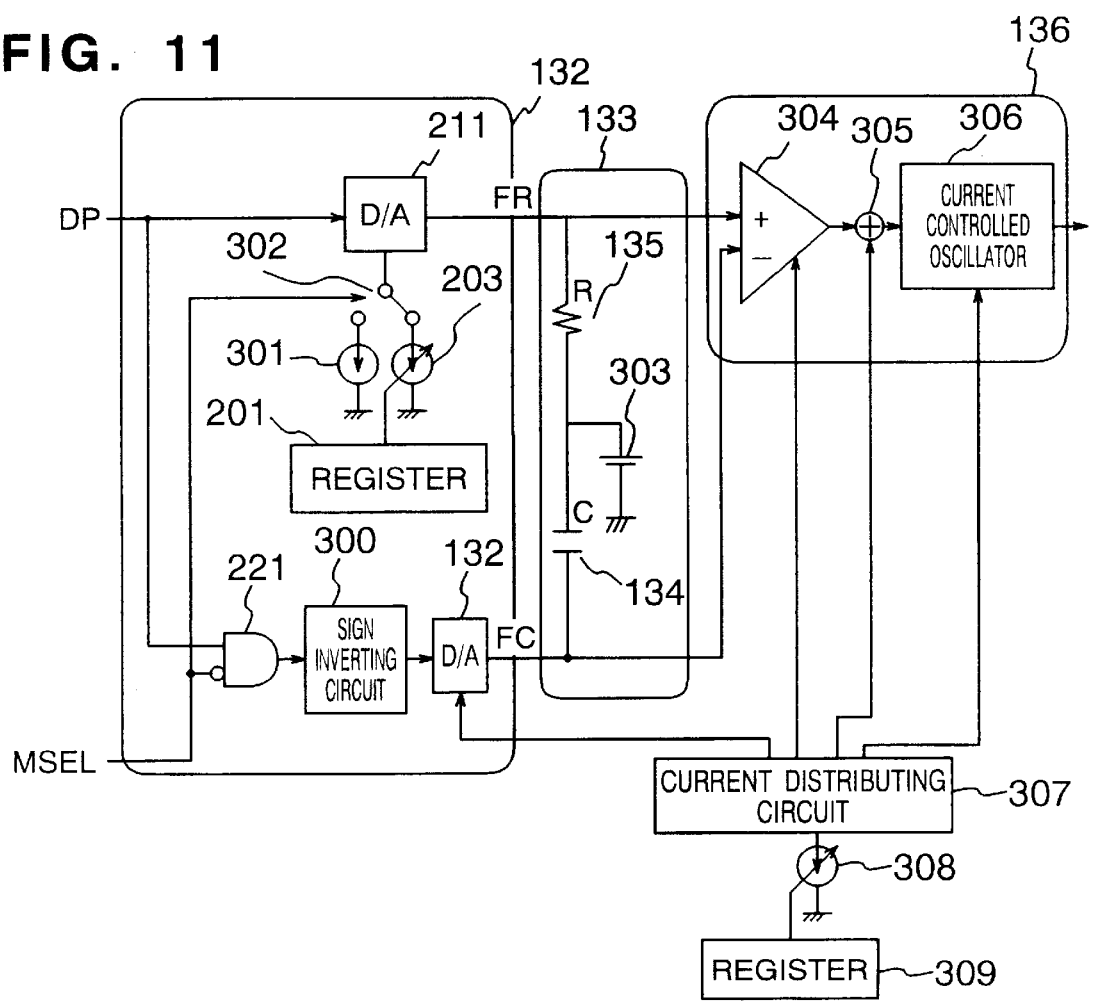
FIG. 11 shows another embodiment of the digital-analog converter, filters and VCO.

FIG. 11 shows an embodiment of the phase lock loop circuit in which the filter circuit 133 and VCO circuit 136 have pseudo-differential characteristics and which corresponds to the constant recording density. In the diagram, reference numeral 300 denotes a sign inverting circuit; 301 a fixed current source; 302 a current selecting circuit; 303 a reference voltage; 304 a transconductance amplifier (gm amplifier); 305 a current adder; 306 a current controlled oscillator; 307 a current distributing circuit; 308 a variable current source; and 309 a register. The other portions having the same functions as those shown in the foregoing drawings are designated by the same reference numerals. The D/A converter 211 controls an amount of current flowing in the resistor 135. At the time of the phase locking operation, namely, when the primary phase lock loop circuit is constructed, the D/A converter 211 operates on the basis of the current that is set by the register 201 and variable current source 203 as a reference. At the time of the phase following operation, namely, when the secondary phase lock loop circuit is constructed, the D/A converter 211 operates on the basis of the fixed current source 301 as a reference. The D/A converter 132 controls an amount of current flowing to the capacitor 134. The D/A converter 132 operates on the basis of the current generated by the current distributing circuit 307 as a reference. The AND circuit 221 outputs the phase error DP to the sign inverting circuit 300 only at the time of the phase following operation (signal MSEL="0"). The AND circuit 221 outputs "0" to the D/A converter 132 through the sign inverting circuit 300 so that the output value is set to "0" at the time of the phase locking operation (signal MSEL="1"). The sign inverting circuit 300 inverts the sign of the phase error DP through the AND circuit 221, and outputs to the D/A converter 132. Since a voltage of the capacitor 134 is inputted to the negative side of the gm amplifier 304, which will be explained hereinlater, the current of the opposite pole is supplied to the capacitor 134, thereby allowing the negative voltage to correspond to the positive direction of the control of the VCO circuit 136. The filter circuit 133 is constructed by the capacitor 134 and resistor 135 by using the reference voltage 303 as a reference voltage. The VCO circuit 136 decides the oscillation frequency by the potential difference between the terminals FR and FC. The gm amplifier 304 generates a current value according to the potential difference between the terminals. The current adder 305 adds currents from the current distributing circuit 307 to decide the center frequency, thereby changing the oscillation frequency of the VCO circuit 136. The current controlled oscillator 306 changes the frequency of the sampling clock by the given current value. A current value of the variable current source 308 changes by the register 309 and is given as a reference current of each section through the current distributing circuit 307. A numerical value which is set into the register 309 indicates the inner rim or outer rim. For example, a track number or the like can be mentioned as such a numerical value.

In the circuit construction described above, the primary and secondary phase lock loop circuits operate as follows.
(1) Primary phase lock loop circuit (MSEL="1")

The D/A converter 211 controls the current flowing to the resistor 135 on the basis of the current of the variable current source 203 set by the register 201 as a reference. Since the D/A converter 132 is made inoperative by the AND circuit 221, the voltage of the capacitor 134 is held. Since the oscillation frequency of the VCO circuit 136 is determined by the potential difference between the terminals FC and FR, the phase control is executed by only the D/A converter 211 and resistor 135. Now, assuming that the value of the current flowing from the D/A converter 211 is set to i1 and the resistance value of the resistor 135 is set to R and the initial voltage of the capacitor 134 is set to Vc, the input differential voltage Vvco of the VCO circuit 136 is expressed as shown by the following equation (5).

$$Vvco = i1 \cdot R + Vc \tag{5}$$

Since the equation (5) is the same as the above equation (1), it will be understood that the phase lock loop circuit of the embodiment is of the primary type. In the primary phase lock loop circuit corresponding to the constant density recording, it is sufficient to change the gain and oscillation frequency of the VCO circuit 136. In accordance with the value set in the register 309, the gain of the gm amplifier 304 is changed, and center frequency of the VCO circuit 136 is changed by the current adder 305. Specifically speaking, when a data transfer frequency is two times as high as the ordinary speed, the gain and oscillation frequency of the VCO circuit 136 are set to the values which are two times as high as the ordinary ones, respectively. The register 201 is used to finely adjust the gain of the primary phase lock loop circuit and it is set irrespective of the data transfer frequency. As mentioned above, the primary phase lock loop circuit corresponding to the constant density recording is constructed.

(2) Secondary phase lock loop circuit (MSEL="0")

Both of the D/A converters 211 and 132 operate and the current of the value corresponding to the phase error flows to the resistor 135 and capacitor 134. The gain of D/A converter 132 is changed by the set of the register 309. When MSEL="0", the oscillation frequency is changed through the current adder 305 by the set values of the register 309 through the current distributing circuit 307 and the variable current source 302. The gain of the VCO circuit 136 is changed by the gm amplifier 304.

It is now assumed that the reference value of the current flowing from the D/A converter 211 is set to i1 as a current of the fixed current source 301, the reference value of the current flowing from the D/A converter 132 is set to i2 as a current of the current distributing circuit 307, the resistance value of the resistor 135 is set to R, the capacitance of the capacitor 134 is set to C, and the Laplace operator is set to s. The input differential voltage Vvco of the VCO circuit 136 is expressed by the following equation (6).

$$Vvco(s)=i1 \cdot R + i2/(s \cdot C) \tag{6}$$

When the current values i1 and i2 of the D/A converters 211 and 132 are shown by the following equation (7), the equation (6) is modified as shown by the following equation (8).

$$i1 = k \cdot i2 \tag{7}$$

$$Vvco(s) = i2(k \cdot R + 1/(s \cdot C)) \tag{8}$$

The equation (8) is almost the same as the equation (3) except that the resistance value R is increased k times. Therefore, it will be understood that the phase lock loop circuit of the embodiment is of the secondary type. As mentioned above, the secondary phase lock loop circuit corresponding to the constant density recording needs the gain variable circuit, oscillation frequency varying circuit, and cut-off frequency varying circuit. The cut-off frequently is showed by the following equation (9).

$$f\text{cut-off} = \frac{1}{k \cdot CR} \tag{9}$$

In the construction of the embodiment, each circuit corresponds as follows. The gain varying circuit is realized by the D/A converter 132 and VCO circuit 136 by using the current distributing circuit 307 as a reference. When the data transfer speed is twice as high as the ordinary speed, the current value of the D/A converter 132 is doubled and the gain of the VCO circuit 136 is doubled. The cut-off frequency can be set in proportion to the transfer speed since the reference current of the D/A converter 211 is set to the fixed current source 301. Since the reference current of the D/A converter 211 is fixed and the reference current of the D/A converter 132 is made proportional to the data transfer speed, the coefficient k shown in the equation (8) is inversely proportional to the data transfer frequency. Therefore, from the equation (8), the cut-off frequency of the filter circuit 133 changes in inverse proportion to the coefficient k, namely, in proportion to the data transfer frequency. The secondary phase lock loop circuit corresponding to the constant density recording is constructed as mentioned above.

As explained above, according to the primary phase lock loop circuit for executing the phase locking operation, the current is supplied to only the resistor 135 and the voltage of the capacitor 134 is fixed and such operations are executed by the AND circuit 221. On the other hand, the secondary phase lock loop circuit for performing the phase following operation can be realized by simultaneously making the D/A converters 211 and 132 operative and the different of potential of the resistor 135 and the capacitor 134 are controlled, respectively.

Although the embodiment has been shown and described with respect to the example in which the phase lock loop circuit of the invention is combined to the phase lock loop circuit corresponding to the constant density recording and the high data transfer speed, the number of circuits necessary to construct the primary phase lock loop circuit is very small and it is constructed by only the AND circuit 221, current selecting circuit 302, variable current source 203, and register 201. The phase lock loop circuit of the invention can be easily constructed.

In the embodiment, the frequency lock loop circuit of the write reference clock have been omitted for convenience of explanation, they can be easily realized by a construction as shown in FIG. 4.

Figure 12:
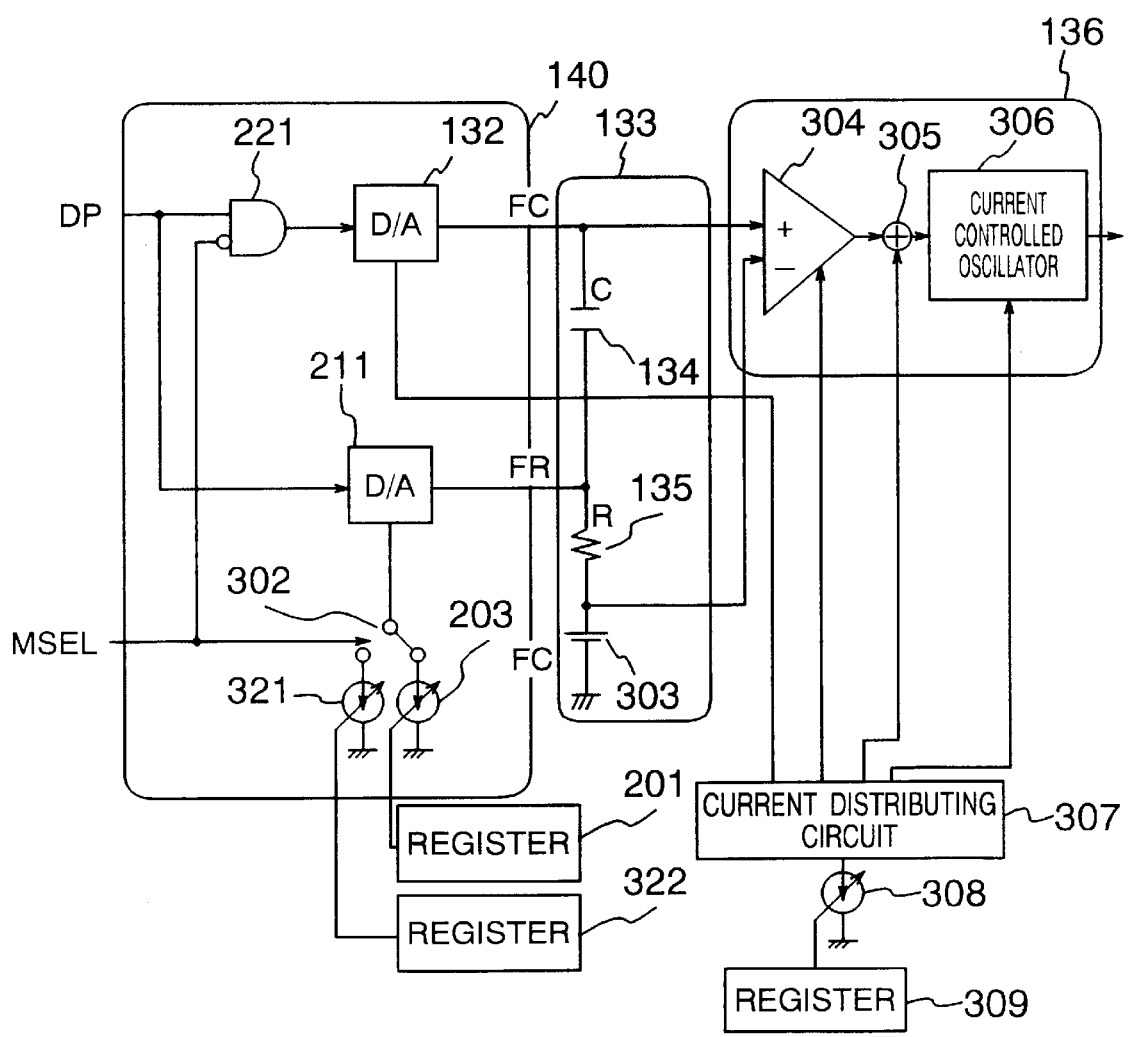
FIG. 12 shows another embodiment of the digital-analog converter, filters and VCO.

FIG. 12 shows another embodiment of the phase lock loop circuit in which the above filter circuit 133 and VCO circuit 136 have pseudo-differential characteristics and which corresponds to the constant recording density. In the diagram, reference numeral 321 denotes a variable current source and 322 indicates a register. The other portions having the same functions as those shown in the foregoing drawings are designated by the same reference numerals. In the embodiment, the primary phase lock loop circuit is constructed by the D/A converter 211, resistor 135, and VCO circuit 136. In this instance, the AND circuit 221 is provided to hold the voltage of the capacitor 134. When the signal MSEL="1", there is neither sink nor source current from the D/A circuit 132. On the other hand, the secondary phase lock loop circuit is constructed by the D/A converters 211 and 132, resistor 135, capacitor 134, and VCO circuit 136. In the embodiment, the reference voltage 303 is connected to the resistor 135 and negative side of the gm amplifier 304. In case of constructing the primary phase lock loop circuit, the same operation as that mentioned above is executed. In case of constructing the secondary phase lock loop circuit, however, the operation slightly differs. In the secondary phase lock loop circuit, since both of the D/A converters 132 and 211 simultaneously operate, the currents of the D/A converters 132 and 211 are simultaneously supplied to the resistor 135. Since the current of the D/A converter 132 is proportional to the data transfer frequency, when it is assumed that the fixed current flows in the D/A circuit 211, the current flowing in the resistor 135 is not proportional to the data transfer speed and the cut-off frequency of the filter circuit 133 is not proportional to the data transfer speed. Therefore, the current is adjusted by the variable current source 321 and register 322 so that the sum of the current flowing in the resistor 135 is proportional to the data transfer speed. Even by the embodiment as mentioned above, the primary and secondary phase lock loop circuits can be easily constructed.

Although the above embodiment of the D/A converter has been described while fixing the reference current of the secondary phase lock loop circuit, the reference current of the primary phase lock loop circuit can be also fixed and the reference current of the secondary phase lock loop circuit can be also made variable. In this case, for the user who uses the present phase lock loop circuit, although the phase locking time of the phase locking operation is fixed, the characteristics at the time of the phase following operation, namely, a jitter of the sampling clock due to the noises mixed to the read waveform can be controlled from the outside, so that the data reproducing performance can be made variable.

According to the invention, by constructing the primary phase lock loop circuit, the high speed phase lock of the phase locking operation can be realized and the phase locking area (PLOSYNC portion in FIG. 2) can be reduced. Thus, the memory capacitance of the magnetic recording reproducing device can be improved. Further, since the steady-state phase error of the primary phase lock loop circuit can be reduced by providing the phase lock loop circuit with the write reference clock, the time of phase lock can be performed at a high speed.

The present invention has been described in detail, it should be understood that various changes, substitutions and alternations can be made hereto without departing from the spirit and scope of the present invention as defined by the appended claims.

What is claimed is:

1. A phase lock loop system comprising:
    sampling means for sampling a signal by a clock signal;
    phase detecting means for detecting a phase error from said sampled signal;
    converting means for converting the phase error detected by said phase detecting means into a first control amount;
    first filter means in which frequency characteristics have no pole;
    second filter means in which frequency characteristics have one or more poles;
    clock generating means for generating said clock signal corresponding to an output of one of said filter means; and
    selecting means for selecting said first or second filter means;
    wherein a primary phase lock loop apparatus is constructed by said phase detecting means, said converting means, and said first filter means having no pole that is selected by said selecting means, and said clock generating means and wherein the primary phase lock loop circuit it is selected during a phase locking operation, and
    wherein a high order phase lock loop apparatus is constructed by said phase detecting means, said converting means, said second filter means having one or more poles that is selected by said selecting means, and said clock generating means and wherein the high order phase lock loop circuit is selected during a phase following operation.

2. A system according to claim 1, wherein after said primary phase lock loop apparatus is made operative, said selecting means makes said high order phase lock loop apparatus operative.

3. A system according to claim 1, further comprising:
    second phase detecting means for detecting a phase difference between a reference clock and said clock signal; and
    second converting means for converting the phase difference detected by said second phase detecting means into a second control amount.

4. A system according to claim 3, further comprising control means for making said second phase detecting means, said second converting means, one of said filter means and said clock generating means operative, for thereafter making said primary phase lock loop apparatus operative, and thereafter for making said high order phase lock loop apparatus operative.

5. A system according to claim 3, further comprising:
    first varying means for varying a conversion gain of said converting means;
    second varying means for varying the frequency characteristics of said filter means;
    third varying means for varying a clock frequency; and
    means for changing said first, second, and third varying means in an interlocking manner in correspondence to a change in said clock frequency.

6. A system according to claim 1, further having varying means for changing a conversion gain of said converting means in an interlocking manner with a selecting condition of said selecting means.

7. A system according to claim 1, wherein said converting means is constructed by first and second converting means which can be switched,
    and in interlocking with said selecting means, only said first converting means is turned on when said primary phase lock loop apparatus operates, and said second converting means is turned on when said high order phase lock loop apparatus operates.

8. A system according to claim 7, further having varying means for changing the conversion gain of said first converting means.

9. A signal recording reproducing device comprising:
    a recording signal processing circuit for converting information to be recorded into a recording signal;
    a reproducing signal processing circuit for converting a signal to be reproduced into reproducing information; and
    a phase lock loop circuit which includes
    a phase error detecting circuit detecting a phase error of an input signal from a sampling clock signal;
    a converting circuit converting the phase error detected by said phase error detecting circuit into a first control signal amount;
    a first filter in which frequency characteristics have no pole;
    a second filter in which frequency characteristics have one or more poles;
    a clock generator generating said sampling clock signal corresponding to an output of one of said filters;
    a selecting circuit selecting said first or second filter;
    wherein a primary phase lock loop circuit is constructed by said phase error detecting circuit, said converting circuit, said first filter having no pole that is selected by said selecting circuit, and said clock generator and wherein the primary phase lock loop circuit is selected during a phase locking operation; and
    wherein a high order phase lock loop circuit is constructed by said phase error detecting circuit, said converting circuit, said second filter having one or more poles that is selected by said selecting circuit, and said clock generator, and wherein the high order phase lock loop circuit is selected during a phase following operation.

10. A signal recording reproducing device comprising:
    recording signal processing means for converting information to be recorded into a recording signal;
    reproducing signal processing means for converting a signal to be reproduced into reproduction information; and a phase lock loop system which includes:

sampling means for sampling a signal by a clock signal;

phase detecting means for detecting a phase error from said sampled signal;

converting means for converting the Phase error detected by said phase detecting means into a first control amount;

first filter means in which frequency characteristics have no pole;

second filter means in which frequency characteristics have one or more poles;

clock generating means for generating said clock signal corresponding to an output of one of said filter means;

selecting means for selecting said first or second filter means;

second phase detecting means for detecting a phase difference between a reference clock and said clock signal; and second converting means for converting the phase difference detected by said second phase detecting means into a second control amount, wherein a primary phase lock loop apparatus is constructed by said phase detecting means, said converting means, and said first filter means having no pole that is selected by said selecting means, and said clock generating means and wherein the primary phase lock loop circuit is selected during a phase locking operation, wherein a high order phase lock loop apparatus is constructed by said phase detecting means, said converting means, said second filter means having one or more poles that is selected by said selecting means, and said clock generating means and wherein the high order phase lock loop circuit is selected during a phase following operation, wherein a reference clock phase lock loop apparatus is constructed by said second phase detecting means, said second converting means, one of said filter means, and said clock generating means, and wherein said reference clock is an operation clock of said recording signal processing means.

11. A signal recording reproducing device according to claim 9, wherein the signal recording reproducing device is formed on an LSI.

12. An information recording reproducing device comprising:

a recording medium for recording information;

a control apparatus for recording and reproducing to said recording medium; and a signal recording reproducing device including:

a recording signal processing circuit for converting information to be recorded into a recording signal;

a reproducing signal processing circuit for converting a signal to be reproduced into reproduction information; and a phase lock loop circuit which includes:

a phase error detecting circuit detecting a phase error of an input signal from a sampling clock signal;

a converting circuit converting the phase error detected by said phase error detecting circuit into a first control signal amount;

a first filter in which frequency characteristics have no pole;

a second filter in which frequency characteristics have one or more poles;

a clock generator generating said sampling clock signal corresponding to an output of one of said filters;

a selecting circuit selecting said first or second filter;

wherein a primary phase lock loop circuit is constructed by said phase error detecting circuit, said converting circuit, said first filter having no pole that is selected by said selecting circuit, and said clock generator, and wherein the primary phase lock loop circuit is selected during a phase locking operation; and wherein a high order phase lock loop circuit is constructed by said phase error detecting circuit, said converting circuit, said second filter having one or more poles that is selected by said selecting circuit, and said clock generator, and wherein the high order phase lock circuit is selected during a phase following operation.

13. A system according to claim 1, wherein said phase lock loop system can be synchronized with a plurality of signal frequency bands and frequencies of poles of said primary phase lock loop apparatus and said high order phase lock loop apparatus are changed in an interlocking manner with said plurality of signal frequency bands.

14. A system according to claim 1, wherein said selecting means has two current switches, said first filter means is selected by short-circuiting one of said two current switches, said second filter means is selected by short-circuiting the other current switch, said primary phase lock loop apparatus is constructed by a phase detecting circuit, a D/A converter, a resistor, and a VCO circuit by short-circuiting said one of the current switches of said selecting means, and said high order phase lock loop apparatus is constructed by a phase detecting circuit, a D/A converter, said resistor, a capacitor, and a VCO circuit by short-circuiting the other current switch of said selecting means.

15. A system according to claim 1, wherein said first filter means and said second filter means commonly use a resistor.

16. A phase lock loop system comprising:

a phase error detecting circuit detecting a phase error of an input signal from a sampling clock signal;

a converting circuit converting the phase error detected by said phase error detecting circuit into a first control signal amount;

a first filter in which frequency characteristics have no pole;

a second filter in which frequency characteristics have one or more poles;

a clock generator generating said sampling clock signal corresponding to an output of one of said filters;

a selecting circuit selecting said first or second filter;

wherein a primary phase lock loop circuit is constructed by said phase error detecting circuit, said converting circuit, said first filter having no pole that is selected by said selecting circuit, and said clock generator, and wherein the primary phase lock loop circuit is selected during a phase locking operation; and wherein a high order phase lock loop circuit is constructed by said phase error detecting circuit, said converting circuit, said second filter having one or more poles that is selected by said selecting circuit, and said clock generator, and wherein the high order phase lock loop circuit is selected during a phase following operation.

* * * * *